United States Patent [19]

Weber

[11] Patent Number: 4,871,584
[45] Date of Patent: Oct. 3, 1989

[54] PROCESS OF COATING AND DRYING BOTH SIDES OF PRINTED CIRCUIT BOARDS

[76] Inventor: Erich Weber, Effnerstr. 89, D-8000 Muenchen 80, Fed. Rep. of Germany

[21] Appl. No.: 128,830

[22] PCT Filed: Jan. 22, 1987

[86] PCT No.: PCT/DE87/00026
§ 371 Date: Nov. 23, 1987
§ 102(e) Date: Nov. 23, 1987

[87] PCT Pub. No.: WO87/04584
PCT Pub. Date: Jul. 30, 1987

[30] Foreign Application Priority Data

Jan. 27, 1986 [DE] Fed. Rep. of Germany ....... 3602350

[51] Int. Cl.$^4$ .............................................. B05D 5/12
[52] U.S. Cl. ..................................... 427/96; 118/503; 118/731; 427/209; 427/384
[58] Field of Search ................ 118/731, 503; 427/209, 427/96, 384

[56] References Cited

U.S. PATENT DOCUMENTS

| 3,610,397 | 10/1971 | Bok | 118/503 |
| 3,777,703 | 12/1973 | Gillie | 118/731 |
| 4,111,155 | 9/1978 | Klein et al. | 118/642 |
| 4,228,582 | 10/1980 | Arai | 29/650 |

OTHER PUBLICATIONS

Gebruder Weber GmbH, Price List, p. 24.

Primary Examiner—Bernard Pianalto
Attorney, Agent, or Firm—Robert J. Koch

[57] ABSTRACT

A very economical process for coating both sides of boards, in particular printed circuit boards, with a liquid coating material, includes the insertion of the boards in a turnover device, wherein first one side is coated, then the board is turned over and the other side is coated. Alternatively, the first side is coated, then the board is turned in a stationary turnover device and its second side is then coated. The process is carried out as follows: 1. Coating the first side of the board. 2. Turning over the board. 3. Coating the second side of the board. 4. Drying both sides together. The board is held or supported during the process by two of its opposite edges.

2 Claims, 1 Drawing Sheet

PROCESS OF COATING AND DRYING BOTH SIDES OF PRINTED CIRCUIT BOARDS

DESCRIPTION

The invention concerns an apparatus for the coating on both sides of plates, in particular circuit boards with a photosensitive lacquer or another liquid coating material, which following its application to both sides of the circuit board, is dried.

The coating on both sides of circuit boards with a photosensitive lacquer is carried out at the present time in a highly efficient manner by the pouring of the lacquer by means of pouring machines. The boards are clamped into a transport slide in their lateral edge zones and transported through the pouring film of the pouring machine. The holding device holding the boards during the pouring process is kept out of the pouring film so that it does not come into contact with the photosensitive lacquer. The boards are then dried in a special dryer of a vertical configuration with the boards in the horizontal position and held by lateral board holders. In the upper turning points the board holders are turned around together with the boards. The reverse side is now on top and is transported through a second pouring machine and a second special dryer. After leaving the coating apparatus, the boards are moved into the copying chamber for further processing.

These known installations require in each case two pouring machines or coating devices and two special dryers. The installations are therefore expensive and require much space.

It is the object of the invention to provide an apparatus of the aforementioned type, which is simpler and less expensive to construct and to operate.

This object is attained in principle according to the invention by that the circuit board is initially transported through a coating device and coated on one side, then turned in the course of its subsequent travel and then coated on the other side, whereupon it is introduced into a common drying device, dried on both sides and finally moved out of said drying device.

The process and the apparatus to carry it out may be designed and effected in a number of ways.

According to a simple embodiment of the apparatus according to the invention, the circuit boards are introduced on one side of the conveyor into the apparatus and deposited therein on a movable board holder, which together with the circuit board is transported through the coating device and then moved to a turning device, turned around and passed through the same coating device, whereupon it enters a common drying device.

Another process with a modified apparatus is when the circuit board is introduced at one end of the conveyor and deposited on a movable board holder, which together with the circuit board is transported to a first coating device, then turned around in a turning device and transported to a second coating device, whereupon it is finally passed through the common drying device.

Obviously, other variants of the configuration and operation of such a coating apparatus are possible. In each case, additional savings in production costs and of energy in the operation of the different individual devices are obtained.

BRIEF DESCRIPTION OF THE DRAWINGS

In the drawings, two different embodiments of the apparatus according to the invention are shown.

DETAILED DESCRIPTION OF THE DRAWINGS

Figure 1:
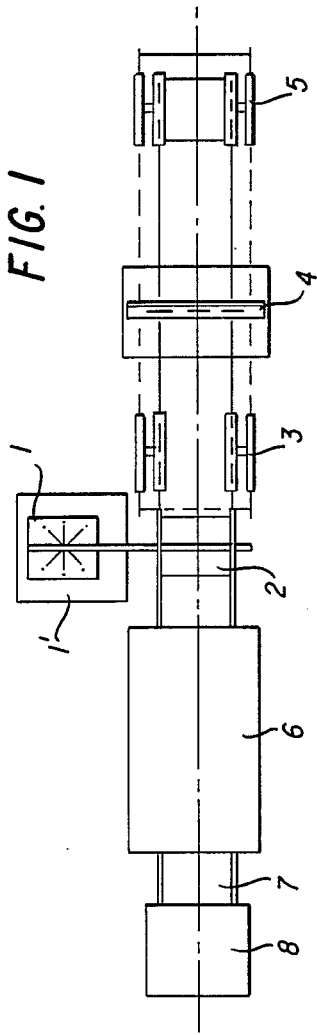
FIG. 1 shows schematically in a top elevation a coating installation with lateral board introduction and one coating device.

In the embodiment of the coating apparatus shown in FIG. 1, a circuit board 1 is moved from a board insertion point 1' to a conveyor 2 and placed onto a movable conveyor device or transport slide 3. The transport slide 3 comprises a turning device and a lateral board holder. With this, it travels through the pouring film of a coating device 4, whereby one side of the circuit board 1 is provided with a coating.

The transport slide 3 with the circuit board 1 on one side is halted on the conveyor and turned around in the device 5. The uncoated side of the circuit board is now on top. In this condition the transport slide 3 now travels back through the same coating device 4 and through its pouring film, whereby the second side of the circuit board 1 is coated. Both sides of the circuit board are thus provided with the coating desired, which cannot be damaged, as the circuit board is being clamped by the holding device of the transport slide 3 on the two outer edges only.

The circuit board coated on both sides is now transported on the conveyor 2 into the dryer 6. Both sides of the circuit board are dried therein uniformly under the same temperature conditions. In this manner, it is possible to eliminate one coating device (pouring machine) and one drying device. Subsequently to the drying device 6, a runout belt 7 is provided, said runout belt leading to a stacker 8 or a cassette.

Figure 2:
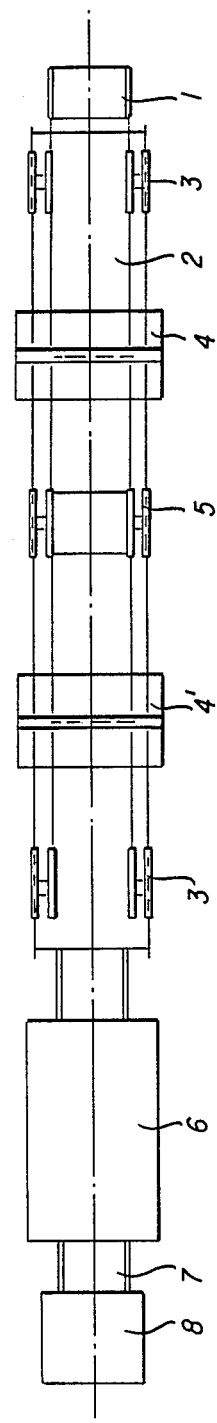
FIG. 2 shows another coating apparatus with board introduction at one end of the installation and with two coating devices.

In the apparatus according to FIG. 2, the circuit board 1 is introduced not from one side as in FIG. 1, but at the front end of the conveyor 2 of the installation by means of an appropriate device. The circuit board 1 travels on the transport 3 with its holder through a first coating device (pouring machine) 4 and then proceeds to a turning device 5. The circuit board is therein turned with its coated side on the bottom, while the as yet uncoated side of the circuit board is on top. In this state, the transport slide travels with the circuit board through the second coating device or pouring machine 4'. Both sides of the board 1 are now provided with the coating and are subsequently introduced into the drying device 6. The board is dried in said drying device, as in the installation according to FIG. 1, from which it is moved to an outlet or a stacker or another location. The apparatus according to FIG. 2 has the advantage that it has no laterally protruding devices such as those shown in FIG. 1.

The invention is not restricted to the forms of embodiment described above and shown in the drawing of the coating installation, but includes all variants serving the same purpose.

I claim:

1. A process for coating both sides of printed circuit boards with a photosensitive lacquer comprising the steps of:

feeding a circuit board to a conveyor belt;

depositing said circuit board from said conveyor belt into a movable board holder which grips said board only at the outer edges of said board;

moving said board holder and said circuit board in a first linear direction to and through a coating device where a first side of said board is coated with photosensitive lacquer in a horizontal position;

moving said board holder with the circuit board, coated on one side, in said first linear direction to a turning station where said board holder, with the board gripped thereon, is turned around by 180°;

passing back the board holder and the board, in a turned alignment to said coating device in a second linear direction, opposite to said first linear direction;

coating a second side of said board in said coating device with photosensitive lacquer in a horizontal position;

moving said board holder and said board, coated on opposing sides in said second linear direction to a drying station where the photosensitive lacquers on both sides of said board are concurrently dried.

2. A process according to claim 1 wherein feeding the circuit board to the conveyor belt comprises feeding said board from one side of the conveyor belt.

* * * * *